(12) United States Patent
Bach et al.

(10) Patent No.: US 7,079,767 B2
(45) Date of Patent: Jul. 18, 2006

(54) WAVELENGTH AND/OR SUBBAND ASSIGNMENT ALGORITHM IN ALL OPTICAL NETWORKS FOR MINIMAL BLOCKING

(75) Inventors: Thuthuy Bach, Ottawa (CA); Ashish Duggal, Kanata (CA)

(73) Assignee: PTS Corporation, San Jose, CA (US)

( * ) Notice: Subject to any disclaimer, the term of this patent is extended or adjusted under 35 U.S.C. 154(b) by 817 days.

(21) Appl. No.: 10/186,109

(22) Filed: Jun. 28, 2002

(65) Prior Publication Data

US 2004/0208557 A1    Oct. 21, 2004

(51) Int. Cl.
*H04J 14/00*     (2006.01)
*H04B 10/20*     (2006.01)

(52) U.S. Cl. ................. 398/45; 370/395.41; 455/452.1

(58) Field of Classification Search .................. 398/45, 398/69, 78, 89, 99; 709/240; 370/229–238, 370/395.41, 389, 392, 397; 455/450, 451, 455/452.1, 452.2
See application file for complete search history.

(56) References Cited

U.S. PATENT DOCUMENTS

| | | | |
|---|---|---|---|
| 6,075,631 A | 6/2000 | Bala et al. | ..................... 398/1 |
| 6,108,311 A | 8/2000 | Ramaswami et al. | ....... 370/258 |
| 2002/0093711 A1* | 7/2002 | Simmons et al. | ........... 359/125 |

* cited by examiner

*Primary Examiner*—Leslie Pascal

(57) ABSTRACT

A system and method for minimizing blocking in optical networks utilizes algorithms developed to reduce non-revenue generating OEO conversions as a result of blocking based on routing and wavelength and/or subband assignment. Demands are prioritized on a basis of optical reach, and regenerators required for overcoming optical reach limitations are strategically placed to overcome blocking.

26 Claims, 5 Drawing Sheets

WAVELENGTH AND/OR SUBBAND ASSIGNMENT ALGORITHM IN ALL OPTICAL NETWORKS FOR MINIMAL BLOCKING

FIELD OF THE INVENTION

The present invention generally relates to optical communications systems and particularly relates to bandwidth and/or regenerator assignment systems and methods for demand and resource management in optical communications systems.

BACKGROUND OF THE INVENTION

For All Optical networks, the wavelength and/or subband (group of wavelengths) assignment for traffic from the source node to the destination node can involve blocking at intermediate nodes, especially when the number of nodes and the number of different demands for bandwidth from point to point in a network is very large. An example of blocking in an optical network 10 is described with reference to FIG. 1. Therein, a first demand 12 includes an optical signal route from origin node 14 through optical switching nodes 16 and 18 to destination node 20. Also, a second demand 22 includes an optical signal route from origin node 24 through optical switching nodes 16, 18, and 20, to destination node 28. Further, a third demand 30 includes an optical signal route from origin node 32 through optical switching node 18, to destination node 20. Blocking occurs at a link from nodes 18 to 20 if the demands 12, 22, and 30 are all assigned with the same wavelength.

Wavelength and/or subband blocking magnitudes depend on several factors. For example, blocking magnitudes depend on the number of intermediate nodes within the optical reach. The larger the number of intermediated switch sites within the optical reach, the more blocking needs to be resolved. However, this number is not something that can be limited unless an over-lay top tier network (with fewer switch sites) is created. Otherwise, the number of intermediate switch sites is totally dependent on the community-of-interest demands. Also, blocking magnitudes depend on the number of point to point demands in a network: The larger the number of different point to point demands, the more blocking occurs. Again, the number of point to point demands in a network cannot be limited unless an over-lay top tier network (with fewer switch sites) is created. Further, optical reach has an indirect effect on blocking magnitudes. Optical reach in itself does not have a direct effect on wavelength and/or subband blocking. However, in general, the longer the optical reach, the larger the number of intermediate switch sites within the optical reach, as above. The question arises—should optical reach be limited? The answer is no because the shorter optical reach would require more distance regenerators in a network. Still further, blocking magnitudes depend on system capacity. Generally, the larger the number of available wavelengths and/or subbands in a single system, the less the blocking. Again, the larger capacity of the systems would also help to reduce the number of systems needed to be deployed and thus reduce the overall cost.

SUMMARY OF THE INVENTION

A system and method for minimizing blocking in optical networks utilizes algorithms developed to reduce non-revenue generating OEO conversions as a result of blocking based on routing and wavelength and/or subband assignment. First, demands having predetermined routes are prioritized based on a comparison of the optical reach of the system and lengths of the predetermined routes. Second, bandwidth is preferentially assigned to demands having routes with lengths not greater than the optical reach. Third regenerators required for overcoming optical reach limitations for demands having routes with lengths greater than the optical reach are strategically placed at blocked links to overcome blocking for those demands wherever possible. The system and method preferably accommodates a subband routing methodology by assigning wavelengths and subbands to demands based on demand priority and wavelength and subband availability.

The system and method of the present invention is advantageous over previous solutions in that it assigns system resources to demands within the optical reach as much as possible, uses regenerators to overcome blocking for demands greater than the optical reach as much as possible, and then uses translators to overcome the residual blocking. This system and method efficiently conserves system resources, including bandwidth, regenerators, and translators, while reducing blocking in the network.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

According to the present invention, demands for bandwith from point to point in an optical communications system are prioritized based on a comparison of optical reach of the network with lengths of routes of the demands. Bandwidth is preferentially assigned to demands having routes with lengths not greater than the optical reach, and regenerators required for overcoming optical reach limitations for demands having routes with lengths greater than the optical reach are strategically placed at blocked links to overcome blocking for those demands wherever possible.

Figure 1:
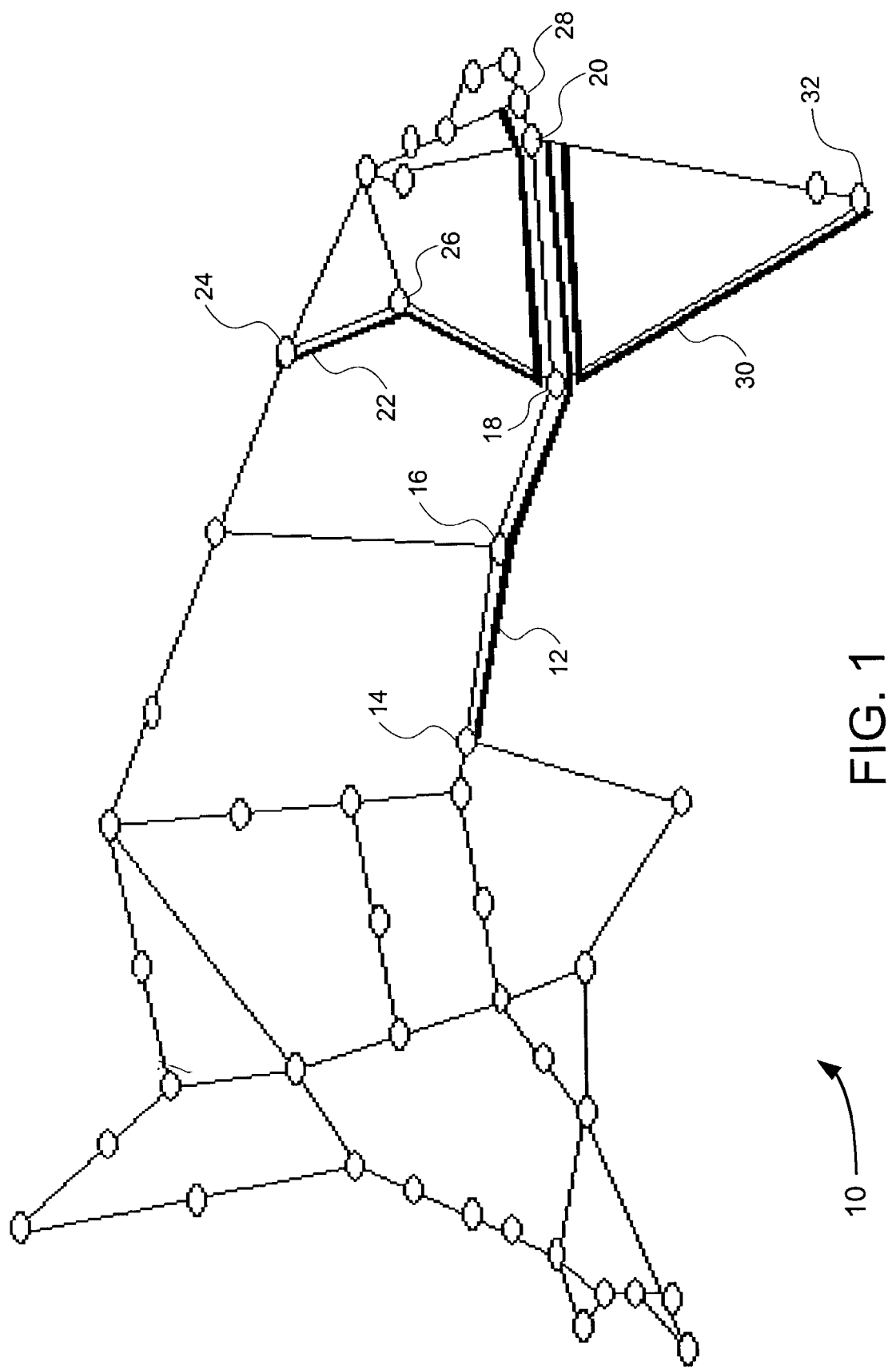
FIG. 1 is a schematic block diagram of an optical communications system with blocking.
Figure 2:
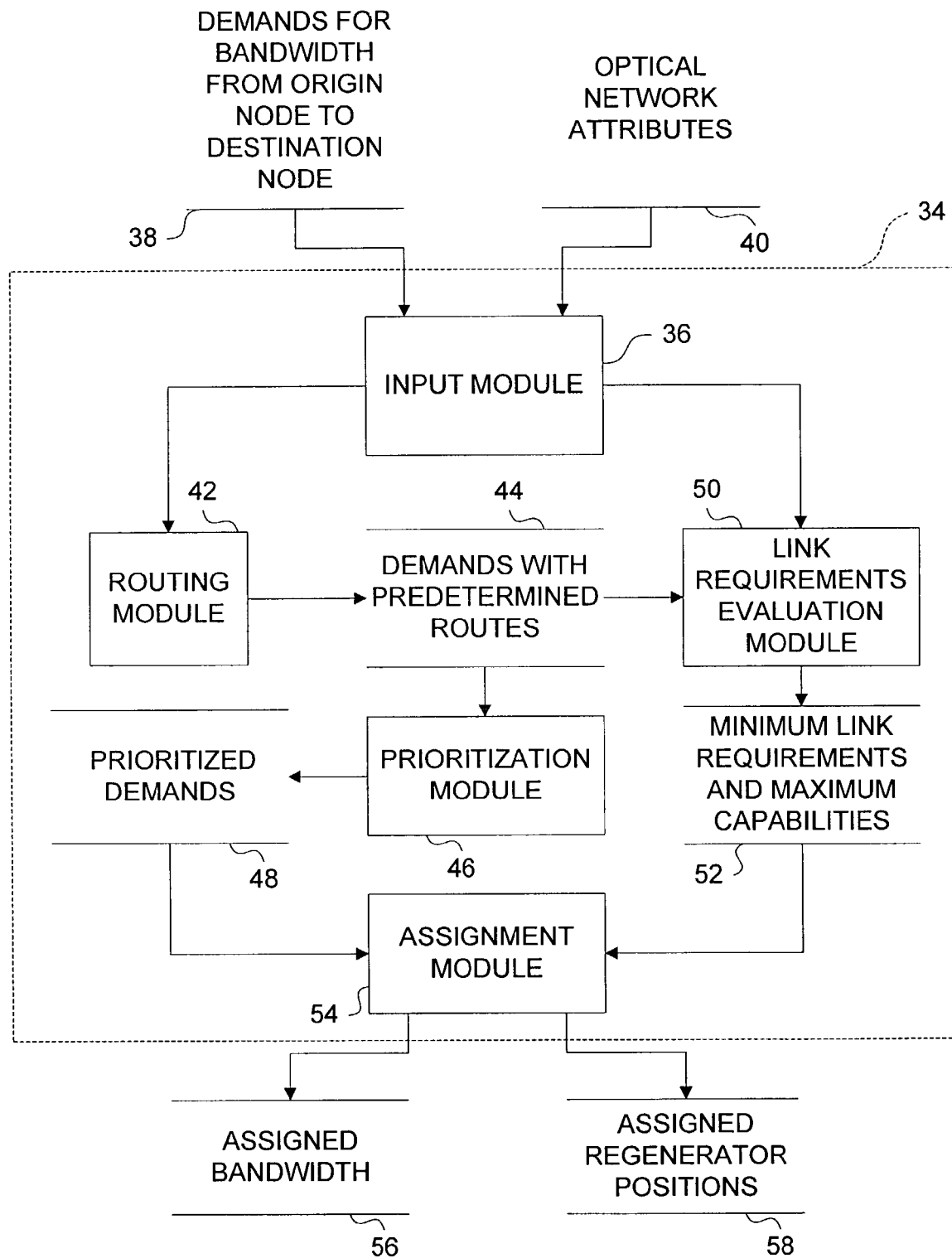
FIG. 2 is a block diagram of a computer-implemented resource allocation system according to the present invention.

A resource allocation system 34 according to the present invention is described with reference to FIG. 2. Therein, an input module 36 is receptive of demands 38 for bandwidth from an origin node to a destination node of the network.

The input module 36 is further receptive of optical network attributes 40. Example optical network attributes include fiber types of the network, line hardware, systems/fiber, subbands per system, channels per subband, network node placement, network node interconnection, and scale of the network. Resource allocation system 34 further has a routing module 42 in communication with input module 36 and operable to route the demands on the network according to a shortest path (SP) and/or shortest cycle (SC) methodology. Hence, routed demands 44 are generated by routing module 42 and communicated to prioritization module 46.

Prioritization module 46 generates prioritized demands 48 with predetermined routes based on a comparison of lengths of demand routes and an optical reach of the network. Preferably, demands with routes having lengths not greater than the optical reach are generally given priority over demands with routes having lengths greater than the optical reach. Notably, the optical reach is fiber-dependent, such that it may vary for demands with different routes where more than one fiber type is present in the network. Preferably, prioritization module 46 is further operable to prioritize demands based on hop count of the demands and the magnitude of the bandwidth required by the demands. For example, a demand passing through seven switch nodes (and thereby having a hop count of eight), is preferably given priority over a demand with a hop count of four. Further, demands with the same hop count are preferably prioritized based on bandwidth requirement, such that demands with higher bandwidth requirements are given priority over demands with lower bandwidth requirements. Of further note, all other demands are preferably given priority over demands with a hop count of zero. Thus, these zero length demands are an exception in that they are preferably not given priority over demands with routes having lengths greater than the optical reach.

Resource allocation system 34 further has a link requirements evaluation module 50 in communication with input module 36 and receptive of routed demands 44. Link requirements evaluation module 48 is operable to compute minimum link requirements and maximum capabilities 52 based on the routed demands 44 and the optical network attributes 40. For example, if each fiber can provide a maximum of two systems, each system can provide a maximum of four subbands, and each subband can provide a maximum of four channels (wavelengths), then if there are a total of sixty-five channels that must be routed through a link, then there must be at least three fibers, and thus six systems. Consequently, the link has a total of ninety-six channels organized into twenty-four subbands. The minimum requirements and maximum capabilities 52 are communicated, along with the prioritized demands 48, to assignment module 54.

Assignment module 54 is operable to generate assigned bandwidth 56 by assigning bandwidth to demands based on their priority. Thus, bandwidth is first assigned to demands with routes having lengths not greater than the optical reach, and bandwidth is next assigned to demands with routes having lengths greater than the optical reach. Also, bandwidth is last assigned to demands with a hop count of zero. Further, prioritization based on hop counts and magnitude of bandwidth requirements is further observed in the assignment process. Preferably, assignment module 54 seeks to use all available unblocked channels on a link and/or, if possible, increase the number of fibers on a link before adding translators to remove blocking. Also, for demands with routes having lengths greater than the optical reach, assignment module 54 is operable to strategically position regenerators required to overcome optical reach limitations within the network to overcome blocking for those links. Thus, assignment module 54 is operable to generate assigned regenerator positions 58 for allocating regenerators in the network. This technique eliminates the need for a translator and thus avoids a costly OEO conversion.

Further embodiments of resource allocation system 34 also exist. For example, routing module 42 may be eliminated where demands are pre-routed and communicated to input module 36. Also, link requirements evaluation module 50 may also be eliminated by communicating pre-evaluated link requirements and maximum capabilities to input module 36. Further, additional embodiments of resource allocation system 34 will be apparent to one skilled in the art from the preceding and subsequent disclosure, wherein the method of the present invention may be implemented in a variety of ways.

Figure 3:
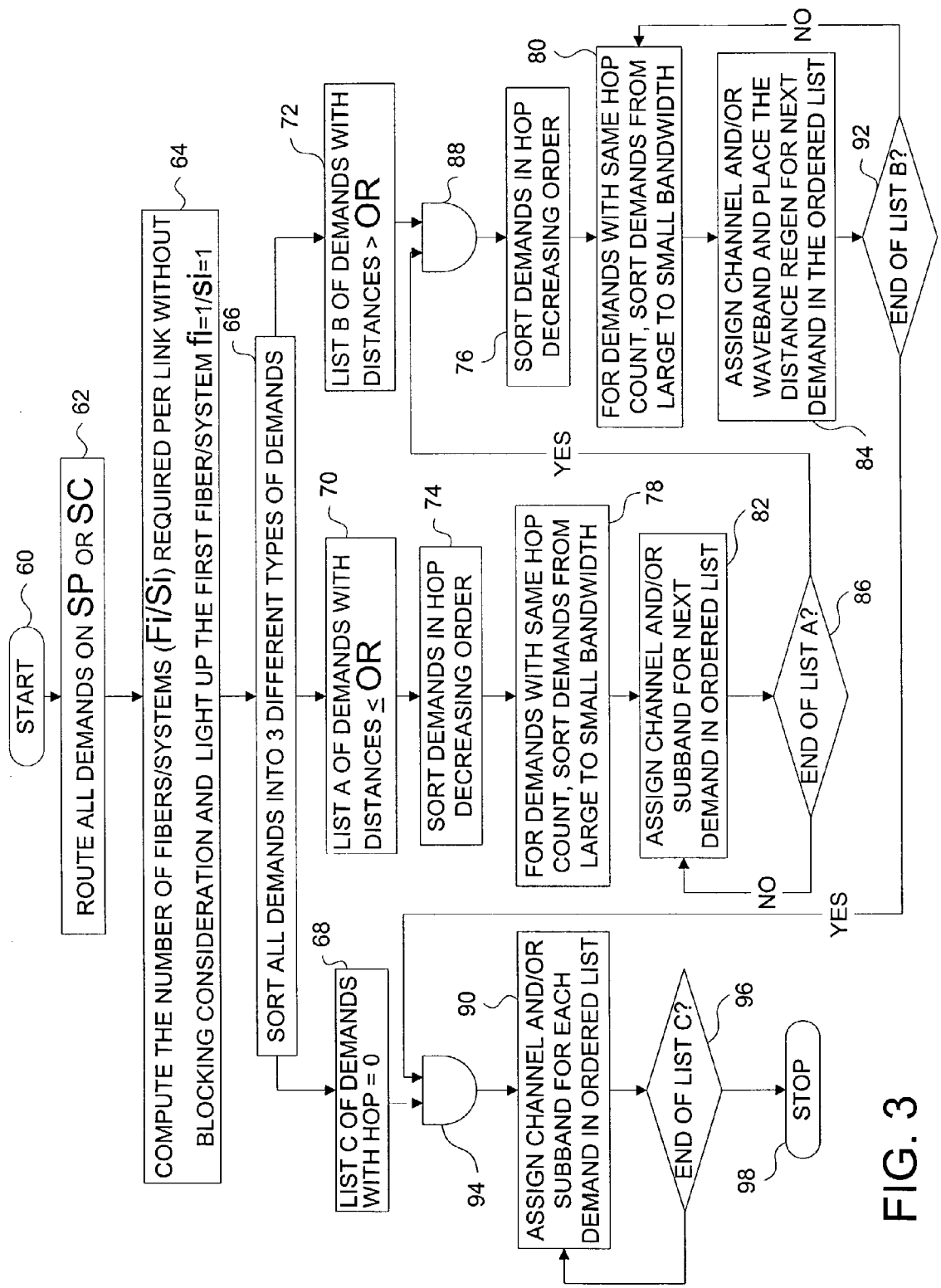
FIG. 3 is a flow chart diagram depicting a method of prioritizing assignment of channels and/or subbands to demands according to the present invention.

The flowchart of FIG. 3 depicts a method for prioritizing demands according to the present invention. Starting at 60, the method proceeds to step 62, wherein all demands are routed on the shortest path or shortest cycle, such that each demand comprises a need for a specific amount of bandwidth from an origin network node to a destination network node through a predetermined route comprising an ordered set of optical switching nodes. As mentioned above, this step is optional because the demands could also be pre-routed and communicated to the present invention.

With demands routed, the method then proceeds to step 64, wherein the number of fibers/systems (Fi/Si) required per link is computed without blocking considerations, and the first fiber/system is lit up such that fi=1/si=1 (where fi is the number of systems/fibers used on link i, and si is the number of subbands used on link i). For example, consider the case where each fiber can provide a maximum of two systems, each system can provide a maximum of four subbands, and each subband can provide a maximum of four channels (wavelengths). If there are a total of sixty-five channels that must be routed through link i, then Fi must equal three and Si must equal six. The first fi and first si can be lit up (powered up and made available but not assigned) until fi$\leq$Fi and si$\leq$Si, but fi cannot exceed Fl and si cannot exceed Si. Similarly as with step 62, step 54 is also optional as this information can be pre-computed and the fiber pre-lit. Thus, the information may be received and/or assumed.

With demands routed and Fi/Si per link computed, the method proceeds to step 66, wherein the demands are prioritized based on optical reach (OR) by sorting the demands into three lists. For example, demands with a hop of zero (thus guaranteed to be less than the optical reach) are sorted into a list 68. Also, demands with routes having lengths$\leq$OR are sorted into a list 70. Further, demands with routes having lengths>OR are sorted into a list 72. The list 70 is given priority over the list 72, which in turn has priority over list 68. With the demands prioritized based on optical reach, further prioritization takes place as needed. For example, lists 70 and 72 are further sorted in hop decreasing order at steps 74 and 76. Further, demands with the same hop count in lists 70 and 72 are sorted in bandwidth decreasing order at steps 78 and 80. Thus, by giving priority to demands with larger bandwidth requirements, then blocking of demands with smaller bandwidth requirements can be overcome, if necessary, with a smaller number of translators than would be required for demands with larger bandwidth requirements. This bandwidth size prioritization is another strategy in reducing non-revenue generating OEO conversions. Channels and/or subbands are-assigned to demands of list 70 first as at 82. Assignment as at 84 of channels and/or subbands to demands of list 72 only occurs after assignment to demands of list 70 has completed as at 86 and 88. Similarly, assignment as at 90 of channels and/or subbands to demands of list 68 only occurs after assignment to demands of list 72 has completed as at 92 and 94. Once assignment of list 68 has been completed as at 96, the method ends at 98.

Figure 4:
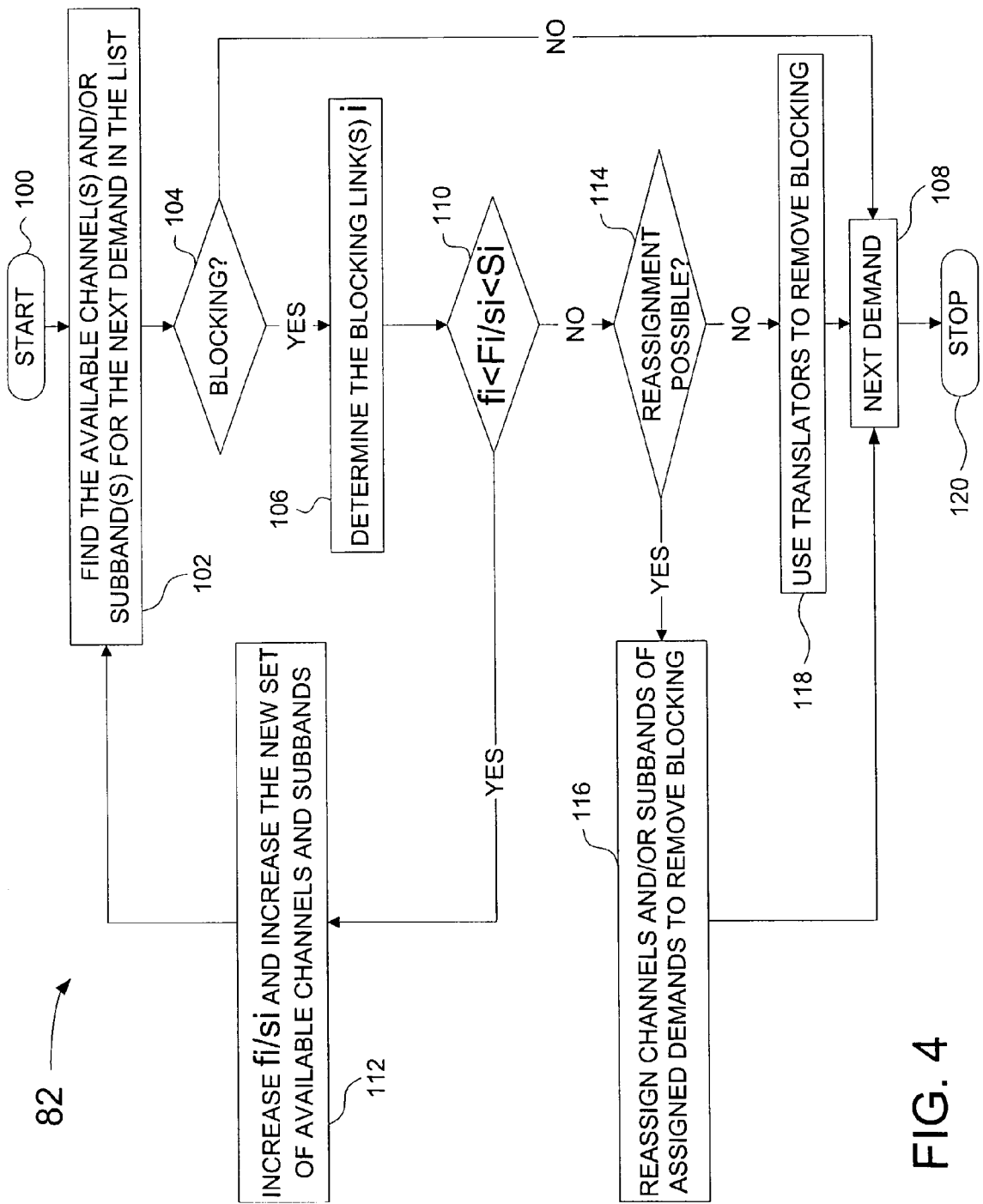
FIG. 4 is a flowchart diagram depicting a method of assigning channels and/or subbands for demands having a length not greater than the optical reach according to the present invention.

A method according to the present invention for accomplishing assignment of list 70 is illustrated in FIG. 4. Therein, step 82 (FIG. 3) is further detailed as a sub-method. The method of FIG. 4 begins at 100 and proceeds to step 102, wherein the available channels and/or subbands for the next demand in the list are found. Depending on whether blocking exists as at 104, the method proceeds to 106, wherein the blocking links are determined, or step 108, wherein the channel(s) and/or subband(s) are assigned to the demand and made unavailable. After blocking links are determined at step 106, then it is determined whether the set of available channels and/or subbands can be increased as at 110. If so, the set is increased and related variables incremented at step 112, and the method returns to step 102. If the set cannot be increased, then the method proceeds to 104 where it is determined if blocking can be removed by reassigning one or more of the assigned channels or subbands of assigned demands. If so, the method proceeds to step 116 wherein the applicable demands are appropriately reassigned new channels and/or subbands. From there, the method proceeds to step 108 wherein the assigned channels and/or subbands are made unavailable. If however, the answer to the test at 114 is no, then the method proceeds to step 118, wherein translators are used to overcome the blocking at the blocked links. The method proceeds from step 118 to step 108, and from there the method ends at 120.

Figure 5:
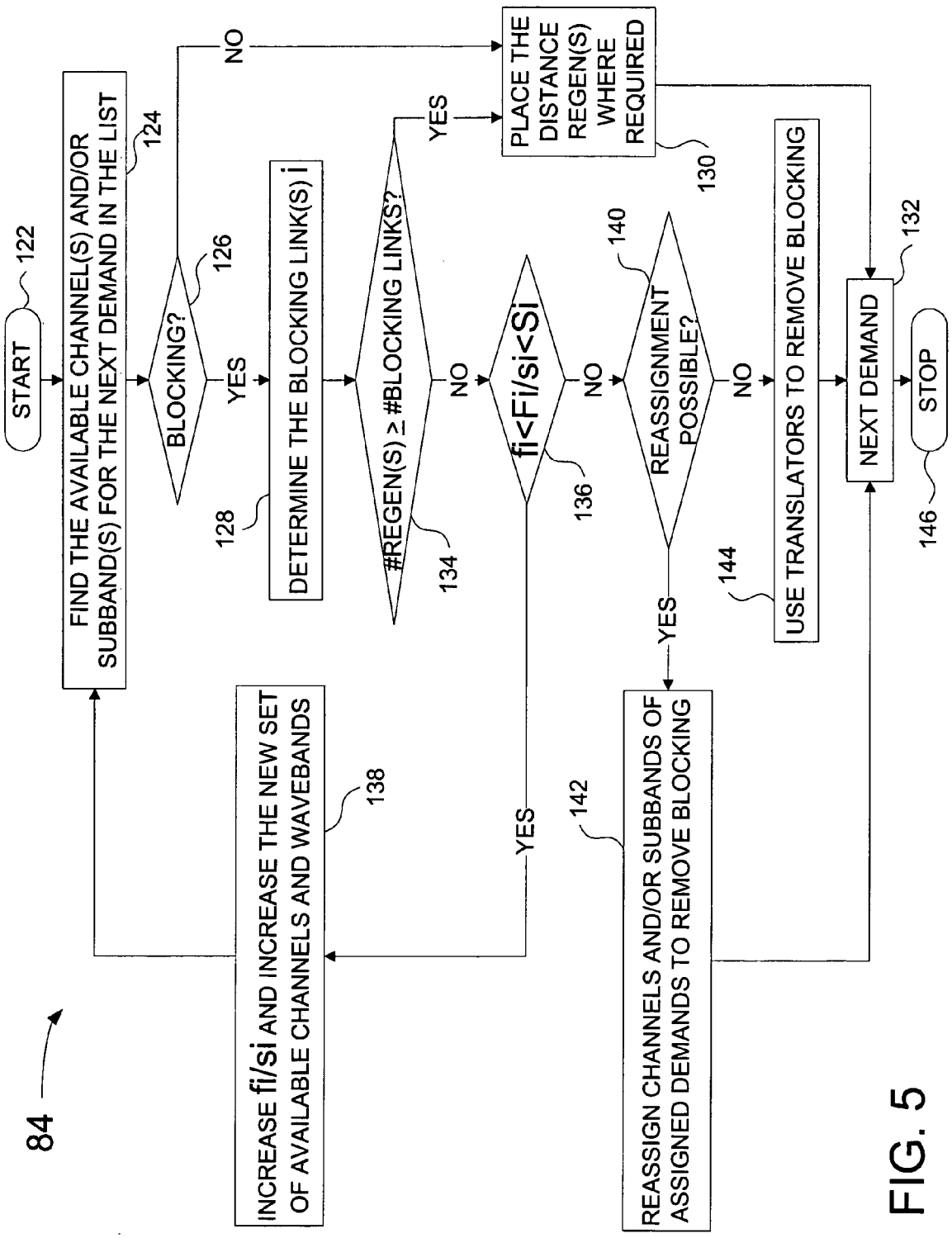
FIG. 5 is a flowchart diagram depicting a method of assigning channels and or subbands with strategic regenerator placement for demands having a length greater than the optical reach according to the present invention.

A method according to the present invention for accomplishing assignment of list 72 (FIG. 3) is illustrated in FIG. 5. Therein, step 84 (FIG. 3) is further detailed as a sub-method. The method of FIG. 5 begins at 122 and proceeds to step 124, wherein the available channels and/or subbands for the next demand in the list are found. Depending on whether blocking exists as at 126, the method proceeds to step 128, wherein the blocking links are determined, or step 130, wherein distance regenerators required to extend the optical reach are placed where required. In the case where there is no blocking, the regenerators are places anywhere along the route of the demand that will efficiently regenerate the optical signal beyond the optical reach to the destination node. Then, the method proceeds to step 132, wherein the channel(s) and/or subband(s) are assigned to the demand and made unavailable. Where blocking exists, then after blocking links are determined at step 128, it is determined whether the number of regenerators required to regenerate the optical signal beyond the optical reach to the destination node is greater than or equal to the number of blocking links as at 134. For example, if the length of the demand route twice, but not thrice, exceeds the optical reach, then two regenerators are required. If there are two blocking links, then these regenerators can be placed at the blocking links to both regenerate the optical signal and overcome blocking at step 130. The case may arise where a blocking link is at the beginning or end of a demand route such that placement there of the regenerator will not sufficiently extend the optical signal beyond the optical reach, and in this case an additional translator may be required. Nevertheless, the odds are that most regenerators required for a blocked demand can be strategically placed in the network to overcome blocking for a link, thereby decreasing the number of costly regenerators otherwise required.

In the case where there are not enough regenerators to match the number of blocked links, it is preferred to check whether the set of available channels and/or subbands can be increased as at 136. If so, the set is increased and related variables incremented at step 138, and the method returns to step 124. If the set cannot be increased, then the method proceeds to 140 where it is determined if blocking can be removed by reassigning one or more of the assigned channels or subbands of assigned demands. If so, the method proceeds to step 142, wherein the applicable demands are appropriately reassigned new channels and/or subbands. From there, the method proceeds to step 132 wherein the assigned channels and/or subbands are made unavailable. If however, the answer to the test at 140 is no, then the method proceeds to step 144, wherein translators are used to overcome the blocking of the blocked links. The method proceeds from step 144 to step 132, and from there the method ends at 146.

Notably, the test at 134 may incorporate criteria to assess whether the regenerators can be successfully placed to both overcome blocking and serve their function as regenerators. Thus, the method can still attempt to increase the set of available channels and/or subbands before adding any additional OEO conversions. Similarly, where the number of regenerators is less than the number of blocked links and the set of available channels and/or subbands cannot be increased, then the method at step 144 can still strategically place the regenerators to overcome blocking and then add translators only as needed.

While the invention has been described in its presently preferred form, it will be understood that the invention is capable of modification without departing from the spirit and scope of the invention as set forth in the appended claims.

What is claimed is:

1. A resource allocation system for use with an optical communications system, comprising:
    an input module receptive of demands for system resources;
    a routing module operable to route the demands through an ordered set of optical switching nodes of the optical communications system;
    a prioritization module operable to perform a prioritization of the demands based on a comparison of an optical reach of the optical communications system and lengths of demand routes; and
    an assignment module operable to assign the system resources based on the prioritization.

2. The system of claim 1, wherein the demands correspond to requirements for bandwidth from an origin network node of the optical communications system to a destination network node of the optical communications system.

3. The system of claim 2, wherein the requirements for bandwidth have a predetermined route through an ordered set of optical switching nodes of the optical communications system.

4. The system of claim 1, wherein the system resources correspond to bandwidth.

5. The system of claim 4, wherein the bandwidth is allocated according to predefined channels, and wherein said assignment module is operable to assign channels to demands based on the prioritization and channel availability.

6. The system of claim 4, wherein the bandwidth is allocated according to predefined channels, wherein the channels are grouped and, routed according to a subband methodology, and wherein said assignment module is operable to assign subbands to demands based on the prioritization and subband availability.

7. The system of claim 1, wherein the system resources correspond to regenerators required to regenerate an optical signal beyond the optical reach.

8. The system of claim 7, wherein said assignment module is operable to assign regenerators to blocked links of the system.

9. The system of claim 1, wherein the prioritization is based on a number of hops characteristic of a demand.

10. The system of claim 1, wherein the prioritization is based on an amount of bandwidth characteristic of a demand.

11. The system of claim 1, wherein said input module is receptive of attributes of the optical communications system.

12. The system of claim 11, wherein said input module is further receptive of minimum link requirements and maximum capabilities.

13. The system of claim 11 comprising a link requirements evaluation module operable to calculate minimum link requirements based on demands with predetermined routes and said attributes of the optical communications system.

14. A resource allocation method for use with an optical communications system, comprising:
receiving information relating to demands for optical communications system resources, including receiving requirements for bandwidth that have a predetermined route through an ordered set of optical switching nodes of the optical communications system;
prioritizing the demands based on a comparison of an optical reach of the optical communications system with a lengths of demand routes; and
assigning the system resources based on said prioritizing.

15. The method of claim 14, wherein said receiving comprises receiving requirements for bandwidth from an origin network node of the system to a destination network node of the system.

16. The method of claim 15 comprising routing the demands.

17. The method of claim 14, wherein said assigning comprises assigning bandwidth to demands based on said prioritizing.

18. The method of claim 17, wherein the bandwidth is allocated according to predefined channels, and wherein said assigning comprises assigning channels to demands based on the prioritization and channel availability.

19. The method of claim 17, wherein the bandwidth is allocated according to predefined channels, wherein the channels are grouped according to a subband routing methodology, and wherein said assigning comprises assigning subbands to demands based on the prioritization and subband availability.

20. The method of claim 14, wherein said assigning comprises assigning regenerators to blocked links of the optical communications system.

21. The method of claim 14, wherein said prioritizing comprises prioritizing the demands based on a number of hops characteristic of a demand.

22. The method of claim 14, wherein said prioritizing comprises prioritizing the demands based on an amount of bandwidth characteristic of a demand.

23. An optical communications system, comprising:
first bandwidth assigned to first demands having a length not greater than an optical reach of the system; and
second bandwidth assigned to second demands having a length greater than the optical reach, wherein the second bandwidth is assigned based on assignment of the first bandwidth; and
regenerators assigned to links of the system based on said second assigned bandwidth, thereby simultaneously overcoming optical reach and blocking restrictions for the second demands,
wherein network bandwidth is allocated in view of routes of demands through one or more ordered sets of optical switching nodes of the optical communications system.

24. The system of claim 23, wherein said first bandwidth and said second bandwidth are allocated according to predefined channels, wherein said channels are grouped and routed according to a subband methodology, and wherein assignment of said bandwidth accommodates said subband routing methodology.

25. The system of claim 23, wherein said first bandwidth and said second bandwidth are assigned to said first demands and said second demands based on a number of hops characteristic of said first demands and said second demands.

26. The system of claim 23, wherein said first bandwidth and said second bandwidth are assigned to said first demands and said second demands based on an amount of bandwidth characteristic of said first demands and said second demands.

* * * * *